United States Patent
Abraham et al.

(10) Patent No.: US 11,206,739 B2
(45) Date of Patent: Dec. 21, 2021

(54) POTTING METHOD

(71) Applicant: Goodrich Actuation Systems Limited, Solihull (GB)

(72) Inventors: David Abraham, Weston on Tent (GB); Stuart Waller, Gloucester (GB)

(73) Assignee: GOODRICH ACTUATION SYSTEMS LIMITED, Solihull (GB)

( * ) Notice: Subject to any disclaimer, the term of this patent is extended or adjusted under 35 U.S.C. 154(b) by 0 days.

(21) Appl. No.: 16/016,751

(22) Filed: Jun. 25, 2018

(65) Prior Publication Data

US 2019/0069416 A1 Feb. 28, 2019

(30) Foreign Application Priority Data

Aug. 28, 2017 (EP) .................................... 17188147

(51) Int. Cl.
| | |
|---|---|
| H05K 3/00 | (2006.01) |
| H05K 3/28 | (2006.01) |
| H05K 1/14 | (2006.01) |
| H05K 5/06 | (2006.01) |
| B29C 39/10 | (2006.01) |
| B29C 39/38 | (2006.01) |
| B29L 31/34 | (2006.01) |
| B29K 105/00 | (2006.01) |

(52) U.S. Cl.
CPC ............... *H05K 3/28* (2013.01); *B29C 39/10* (2013.01); *B29C 39/38* (2013.01); *H05K 1/144* (2013.01); *H05K 5/065* (2013.01); *B29K 2105/0061* (2013.01); *B29L 2031/3481* (2013.01); *H05K 2201/0133* (2013.01); *H05K 2201/0162* (2013.01); *H05K 2201/042* (2013.01); *H05K 2203/1327* (2013.01); *H05K 2203/1361* (2013.01)

(58) Field of Classification Search
CPC .......... H05K 3/28; H05K 1/144; H05K 5/065; H05K 2201/042; H05K 2203/132; B29C 39/10; B29C 39/38; B29K 2105/0061; B29L 2031/3481
See application file for complete search history.

(56) References Cited

U.S. PATENT DOCUMENTS

| | | | |
|---|---|---|---|
| 6,127,038 A | 10/2000 | McCullough | |
| 8,359,172 B2 | 1/2013 | Fattah | |
| 8,592,256 B2* | 11/2013 | Okugawa | H05K 3/0011 438/108 |
| 9,087,670 B2* | 7/2015 | Wang | H05K 1/0256 |
| 9,281,458 B2 | 3/2016 | Keith et al. | |
| 9,651,513 B2 | 5/2017 | Dunlap et al. | |
| 2004/0262749 A1* | 12/2004 | Matayabas, Jr. | H01L 23/3121 257/734 |
| 2006/0214153 A1* | 9/2006 | Ikezawa | H01L 21/563 257/40 |
| 2006/0220260 A1 | 10/2006 | Takahashi | |

(Continued)

OTHER PUBLICATIONS

Extended European Search Report for International Application No. 17188147.7 dated Jan. 5, 2018, 7 pages.

*Primary Examiner* — Pete T Lee
(74) *Attorney, Agent, or Firm* — Cantor Colburn LLP

(57) ABSTRACT

A method of potting e.g. a stack of printed circuit boards, the method comprising applying a first potting material to selected regions of the circuit to be potted and then applying a second, different, potting material over the circuit to be potted.

5 Claims, 1 Drawing Sheet

(56) References Cited

U.S. PATENT DOCUMENTS

| | | | |
|---|---|---|---|
| 2006/0226525 A1* | 10/2006 | Osuga | H01L 23/3128 |
| | | | 257/685 |
| 2007/0125576 A1 | 6/2007 | Karmazyn | |
| 2014/0151868 A1 | 6/2014 | Bayerer | |
| 2014/0239508 A1* | 8/2014 | Ichikawa | H01L 21/76898 |
| | | | 257/774 |
| 2015/0344697 A1* | 12/2015 | Nam | H01L 31/048 |
| | | | 257/790 |
| 2016/0225693 A1* | 8/2016 | Tolentino | H01L 24/29 |
| 2016/0365340 A1* | 12/2016 | Tajima | H01L 25/50 |
| 2018/0294249 A1* | 10/2018 | Watanabe | H01L 25/0652 |

* cited by examiner

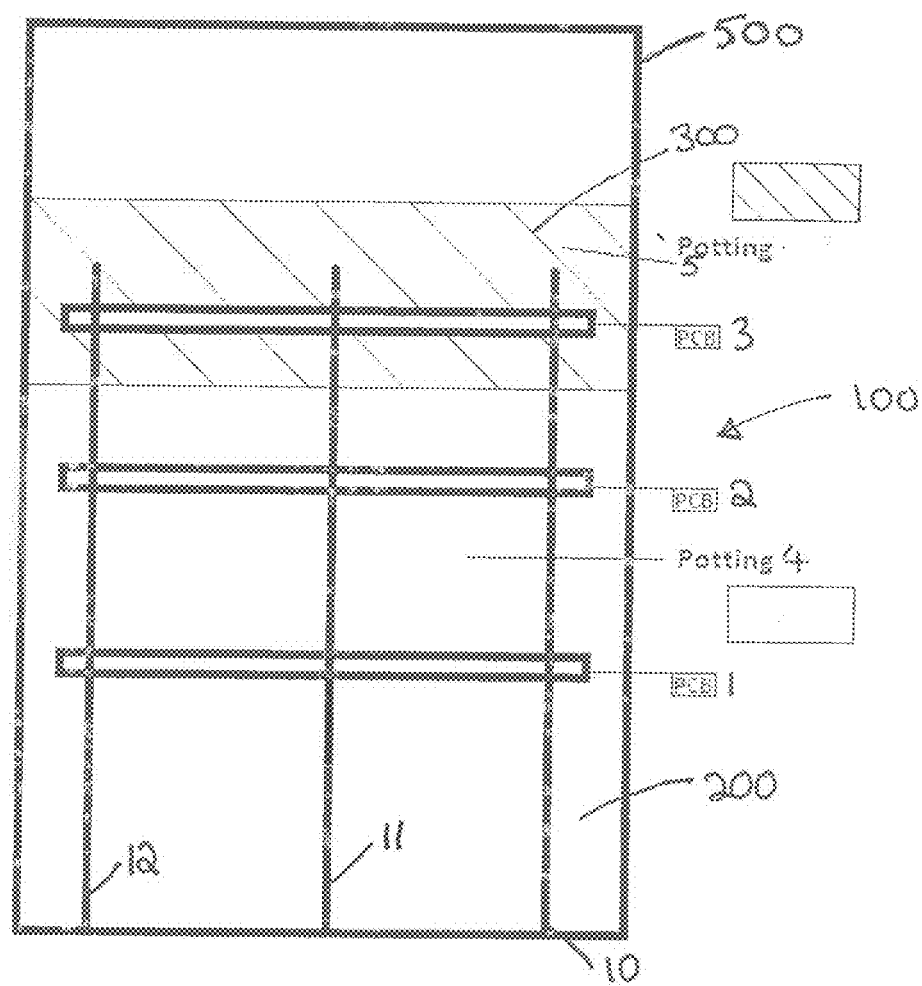

POTTING METHOD

FOREIGN PRIORITY

This application claims priority to European Patent Application No. 17188147.7 filed Aug. 28, 2017, the entire contents of which is incorporated herein by reference.

TECHNICAL FIELD

The present disclosure is concerned with methods of potting components such as pcbs, particularly pcb stacks, and is particularly useful for components used in extreme environments such as environments where the components can be subject to extreme temperatures, shock, vibration and/or extreme pressure.

BACKGROUND

It is known for e.g. electronic circuits and components to encase the circuits/components, also known as 'potting' to provide a protective casing around the circuit to protect the fragile electronics from damage. This is particularly important where the electronics are used in harsh environments where they may be subjected to extremes of temperature or pressure or to shocks or high vibrations. An example of such an environment is in the aerospace industry.

Where a system requires several electronic circuits, it is often preferable to form the various circuits on printed circuit boards (pcbs) which are arranged in a stack of pcbs, to save space. In aircraft, for example, space for electronics may be at a premium.

It is common practice for such stacks to be potted with a polymeric material to enhance the overall structural rigidity and to protect against shock, vibrations etc and also to act as a medium to dissipate heat generated from powered electric components. Depending on the volume of potting and the maximum/minimum exposure temperatures, expansion or contraction of the potting material can induce significant stresses which could result in damage to the circuit board or the interconnecting mechanical and electrical joints.

Existing potting compounds have a high density and have a high rate of expansion when heated, and a high rate of contraction when cooled. At extreme temperatures, therefore, the potting can stress the circuit components and/or joints.

The present disclosure is to a method of improving potting to avoid these problems.

SUMMARY

According to the present disclosure there is provided a method of potting comprising applying a first potting compound to selected regions of the circuit to be potted and then applying a second, different, potting compound over the circuit to be potted.

The first potting compound is preferably less dense than the second and can be applied to areas of the circuit or pcb stack more prone to damage or more fragile e.g. to the areas of mechanical or electrical interconnecting joints. This compound is selected to apply less stress to these areas when heated or cooled. The first compound is usually a compound that has a lower rate of expansion and/or contraction when heated/cooled.

The second compound can then be a conventional potting compound applied over the whole circuit to be encased including over the first compound. The second potting can be applied over a top surface of the circuit part of which has been potted in the first potting material or, indeed, over other surfaces.

The method of this disclosure therefore offers a degree of design optimisation by using a hybrid of different potting compounds to allow specific regions to be potted with materials that, when cured, offer the necessary structural rigidity but provide vibration damping in the case of increased rigidity. Regions of structural potting can be controlled by pre-potting with materials that induce less stress, therefore reducing the overall stresses induced on the interconnecting mechanical and electrical bonding joints. This is achieved by having multiple potting and curing stages to enable the hybrid potting to be built up in layers.

Preferred embodiments will now be described, by way of example only, with reference to the drawing.

BRIEF DESCRIPTION OF THE DRAWING

FIG. 1 is a schematic view of how the potting method of this disclosure can be used.

DETAILED DESCRIPTION

FIG. 1 shows an example pcb stack 100 to be potted. In the example, the stack comprises three pcbs 1,2,3 and interconnections 10, 11, 12, which may be wires, welds, bonds or other mechanical or electrical interconnections between, to and from the pcbs. Of course any other devices, components or circuitry units can be potted according to the method.

In the example, there is a desire to reduce stresses on the lower two pcbs 1,2 and on the interconnections 10, 11, 12, whilst ensuring that the stack has the required rigidity.

The potting method of this disclosure involves pre-potting selected regions of the stack 100—here the lower two pcbs 1,2 and interconnections 10, 11, 12, using a first potting material 200 selected to provide some damping to these regions. The first potting material is preferably less dense than conventional potting material and may be e.g. a gel-type material. The potting of the selected regions is performed in a known manner and the first potting material is cured.

The stack 100 is preferably provided in a housing 500 and the first potting material is, in examples such as that shown, poured or dispensed into the housing first to pot the selected parts of the unit. This is then cured. After curing, the housing is topped up with a second potting material. The second potting stage is performed by applying potting of the second, different potting material 300 over the top pcb 3 and over the first potting material 200 to provide a desired greater rigidity at the top of the unit which is more subject to impact etc. The second potting material is preferably denser than the first and may be e.g. a conventional silicone elastomer material. This is applied in any known manner and is cured.

FIG. 1 is just one example. The method of this disclosure allows any selected regions to be pre-potted. The stresses induced on the circuit will be accommodated by the first potting material rather than the stresses being applied directly to the selected regions e.g. individual pcbs or interconnections.

Depending on the unit, and whether there is clearance in the housing 500, the second potting 300 could also extend around the sides and even the bottom of the unit in the housing.

As an example, the inventor has experimented with Dow Corning™ EE3200 potting for the first potting material and Sylgard™ 1700 for the second potting material, but these are just two of many possible examples.

The potting method of this disclosure can find application in a wide range of industries where potting of circuitry is necessary, and where vibration damping is desirable.

The invention claimed is:

1. A method of potting a circuit unit comprising a stack of two or more printed circuit boards, the method comprising:
   stacking the two or more printed circuit boards connected by interconnections to assemble the circuit unit;
   performing a first potting stage by applying a first potting material to pot selected regions of the circuit unit following assembly of the circuit unit through the stacking, wherein the selected regions include one or more printed circuit boards of a lower part of the stack or one or more interconnections of the lower part of the stack; and
   performing a second potting stage by applying a second, different potting material over the circuit unit and over the first potting material, wherein the first potting material has a lower density than the second potting material.

2. The method of claim 1 further comprising curing the first potting material before the second potting stage and curing the second potting material after the second potting stage.

3. The method of claim 1, wherein the first potting material is a gel-type material and the second potting material is an elastomer material.

4. A potted circuit unit comprising:
   a circuit unit comprising a stack of two or more printed circuit boards connect by interconnections;
   a first potting material applied to pot selected regions of the circuit unit after the two or more printed circuit boards are stacked to assemble the circuit unit, wherein the selected regions include one or more printed circuit boards of a lower part of the stack or one or more interconnections of the lower part of the stack; and
   a second, different potting material applied over the circuit unit and over the first potting material, wherein the first potting material has a lower density than the second potting material.

5. The potted circuit unit of claim 4, wherein the first potting material is a gel-type material and the second potting material is an elastomer material.

\* \* \* \* \*